(12) United States Patent
Zhao et al.

(10) Patent No.: US 11,569,161 B2
(45) Date of Patent: Jan. 31, 2023

(54) INTEGRATED MEMORY COPLANAR TRANSMISSION LINE PACKAGE HAVING GROUND PATH THAT BRACKETS DATA PATH TO EXTEND MEMORY SPEEDS

(71) Applicant: Intel Corporation, Santa Clara, CA (US)

(72) Inventors: Chong Zhao, West Linn, OR (US); James McCall, Portland, OR (US); Michael Gutzmann, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 855 days.

(21) Appl. No.: 16/260,623

(22) Filed: Jan. 29, 2019

(65) Prior Publication Data

US 2020/0243433 A1     Jul. 30, 2020

(51) Int. Cl.
*H01L 23/498*     (2006.01)
*H01L 27/108*     (2006.01)

(52) U.S. Cl.
CPC .. *H01L 23/49838* (2013.01); *H01L 23/49816* (2013.01); *H01L 23/49822* (2013.01); *H01L 27/108* (2013.01)

(58) Field of Classification Search
None
See application file for complete search history.

(56) References Cited

U.S. PATENT DOCUMENTS

| | | | |
|---|---|---|---|
| 7,994,631 B1* | 8/2011 | Zhang | H01L 23/055 257/691 |
| 2005/0026476 A1* | 2/2005 | Mok | G01R 1/07342 439/81 |
| 2005/0098886 A1* | 5/2005 | Pendse | H01L 23/49838 257/E23.079 |
| 2013/0106528 A1* | 5/2013 | Christian | H05K 1/0251 333/33 |
| 2020/0066641 A1* | 2/2020 | Aygun | H01L 23/50 |
| 2020/0294901 A1* | 9/2020 | Strong | H01L 21/481 |

* cited by examiner

*Primary Examiner* — Michael Jung
(74) *Attorney, Agent, or Firm* — Schwabe, Williamson & Wyatt, P.C.

(57) ABSTRACT

Embodiments disclosed herein include electronic packages and methods of forming such packages. In an embodiment, the electronic package comprises a package substrate, that comprises a bumpout region on a first surface of the package substrate, and a pin region on a second surface of the package substrate. In an embodiment, a data path from the bumpout region to the pin region is included in the electronic package. In an embodiment, a ground path brackets the data path from the bumpout region to the pin region.

8 Claims, 8 Drawing Sheets

INTEGRATED MEMORY COPLANAR TRANSMISSION LINE PACKAGE HAVING GROUND PATH THAT BRACKETS DATA PATH TO EXTEND MEMORY SPEEDS

TECHNICAL FIELD

Embodiments of the present disclosure relate to electronic packaging, and more particularly, to electronic packaging architectures that utilize an end-to-end coplanar routing scheme from the C4 bumps to the package pin.

BACKGROUND

With more performance required per socket and as more cores are added into the CPU, memory bandwidth demand is the key enabler for scaling CPU performance. Due to the high density routing in package, crosstalk in the package is the major barrier to reach higher memory speeds for single ended interfaces.

The current approach for routing in package is to increase the input/output (I/O) bump pitch and use stripline routing. This is effective at low memory speeds, but is limited for future scaling. Particularly, as silicon processes continuing to shrink, and the number of memory channels increase with higher memory speeds, stripline routing is not effective. For example, the crosstalk in stripline routing architectures makes such routing solutions impracticable for continued scaling.

EMBODIMENTS OF THE PRESENT DISCLOSURE

Described herein are electronic packages that comprise an end-to-end coplanar routing scheme from the C4 bump region to the package pin, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, stripline routing architectures are not able to scale to match the market demands for increased signaling rates. Particularly, as the signaling rate exceeds 10 GT/s, stripline routing is no longer an effective solution due to increased cross-talk between signal lines. Accordingly, embodiments disclosed herein include a routing architecture that comprises an "end-to-end" coplanar package routing. As used herein, "end-to-end" refers to a signal lines that have a coplanar package routing arrangement from the controlled collapse chip connection (C4) region to the pin. In such embodiment, the coplanar routing provides improved mitigation of crosstalk and allows for improved data rates, (e.g., 10 GT/s or greater).

Furthermore, embodiments disclosed herein allow for such end-to-end coplanar routing while conforming to current I/O designs. As such, current double data rate synchronous dynamic random access memory (DDR SDRAM) layouts, such as DDR5 I/O layouts may be used, as is. The existing DDR DRAM layouts may be used since extra space to allow for coplanar routing is obtained between pads on the routing layer by using via offsets and redistributed signal via and ground via placements.

Accordingly, embodiments with end-to-end coplanar routing significantly reduce crosstalk without growing the silicon die area, and can utilize fewer package layers. Such advantages provide significant costs savings. With respect to reduced crosstalk, embodiments disclosed herein have shown between a 50% and 70% reduction in crosstalk compared to similar stripline architectures, such as those described above.

Figure 1:
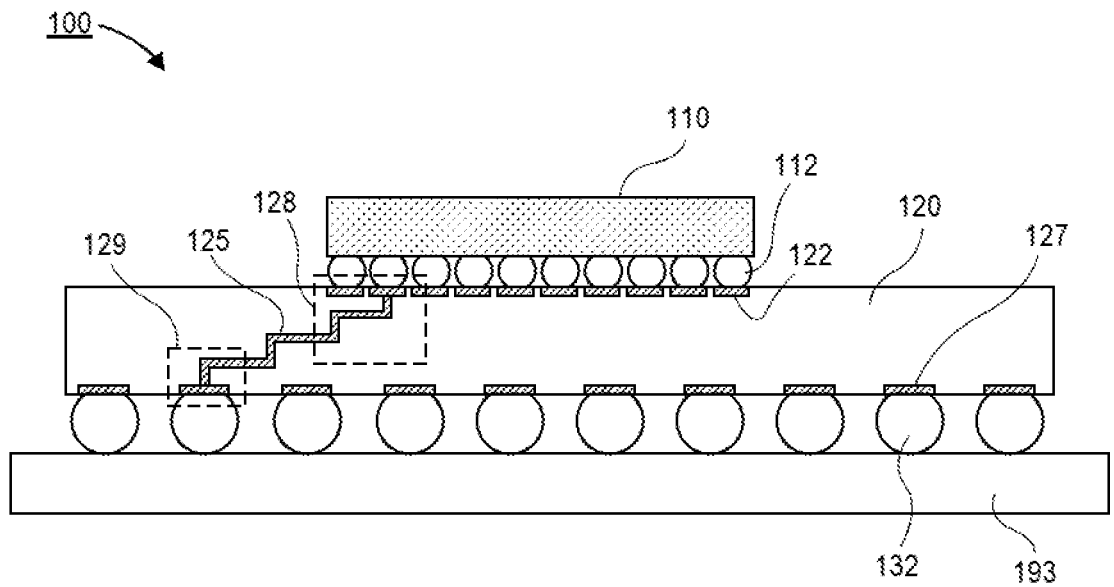
FIG. 1 is a cross-sectional illustration of an electronic package that includes an end-to-end coplanar routing scheme from the C4 bumps to the package pin, in accordance with an embodiment.

Referring now to FIG. 1, a cross-sectional illustration of an electronic system 100 is shown, in accordance with an embodiment. In an embodiment, the electronic system 100 may comprise a board 193, such as a printed circuit board (PCB). The board 193 may be any suitable PCB as known in the art. In an embodiment, a package substrate 120 may be coupled to the board 193. The package substrate 120 is shown as being coupled to the board 193 with interconnects 132. Interconnects 132 are illustrated as solder bumps, but it is to be appreciated that any interconnect 132 (e.g., pins or the like) may be used to couple the package substrate 120 to the board 193.

In an embodiment, a die 110 is coupled to the package substrate 120. The die 110 may be any die including transistors or other circuitry including active or passive devices. The die 110 may comprise silicon, III-V semiconductor materials, or any other semiconductor material. In a particular embodiment, the die 110 may be a CPU or the like. In an embodiment, the die 110 may be coupled to the package substrate 120 with interconnects 112. In a particular embodiment, the interconnects 112 may comprise controlled collapse chip connection (C4) bumps.

In an embodiment, the package substrate 120 may comprise routing 125 that extends from pads 122 on a first surface (i.e., a surface layer) of the package substrate 120 to a pin pad 127 on a second surface (i.e., a bottom layer) of the package substrate 120. The routing 125 may comprise vias, pads, and/or traces. The routing 125 may comprise a conductive material (e.g., copper). The routing 125 may comprise a single layer or multiple layers of more than one conductive material (e.g., barrier layers, or the like). In an embodiment, a first end of the routing 125 may be in the bumpout region 128 of the package substrate 120 and a second end of the routing 125 may be in the pin region 129 of the package substrate 120.

In an embodiment, the routing 125 may be a data line for sending data to and/or from the die 110. In an embodiment, the routing 125 may be a trace in a coplanar routing configuration. That is, the routing 125 may be bracketed by a ground trace on either side (i.e., out of the plane shown of FIG. 1). The coplanar routing may begin at the bumpout region 128 and end at the pin region 129. That is, the routing 125 may comprise an end-to-end coplanar routing configuration. Accordingly, the routing 125 may have significant cross-talk reduction compared to stripline routing.

Figure 2:
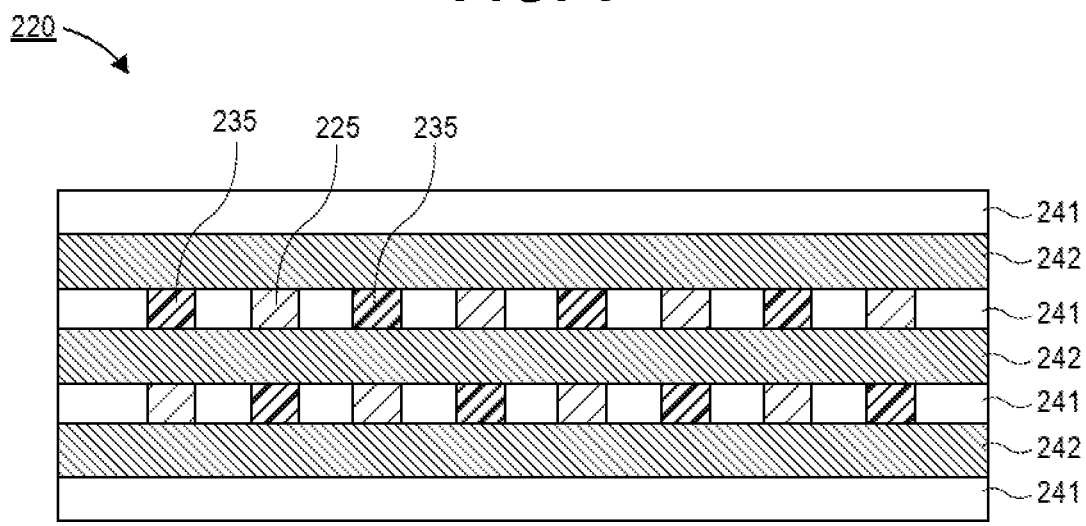
FIG. 2 is a cross-sectional illustration of an electronic package that comprises a plurality of data traces that are each bracketed by a ground trace to form a coplanar routing scheme, in accordance with an embodiment.

Referring now to FIG. 2, a cross-sectional illustration of a package substrate 220 is shown, in accordance with an embodiment. The package substrate 220 illustrates the coplanar routing configuration in various routing layers 241 of the package substrate 220. In an embodiment, the routing layers 241 may be separated from each other by dielectric layers 242. In an embodiment, the routing layers 241 may comprise a plurality of data traces 225 and ground traces 235. As shown, the data traces 225 may be alternated with ground traces 235 so that each data trace 225 is coupled on either side with a ground trace 235.

Such an architecture is referred to as coplanar since the data traces 225 and the ground traces 235 are positioned in the same plane as each other. In contrast, a stripline configuration would include the ground traces 235 being above and/or below the data traces 225. Since the ground traces 235 are coplanar with the data traces, fewer package layers (e.g., layers 241 and 242) may be needed in order to provide the necessary routing. In the illustrated embodiment, two routing layers 241 with data traces 225 and ground traces 235 are shown. However, it is to be appreciated that any number of routing layers 241 may include data traces 225 and ground traces 235 in order to provide the desired routing for a given package substrate.

Referring now to FIGS. 3A-3F, a series of illustrations are shown that depict a bumpout region of a package substrate. FIGS. 3A-3F depict how a standard C4 bumpout region may be reconfigured using via offsets and via redistributions in order to provide adequate room for coplanar routing in the bumpout region.

Figure 3A:
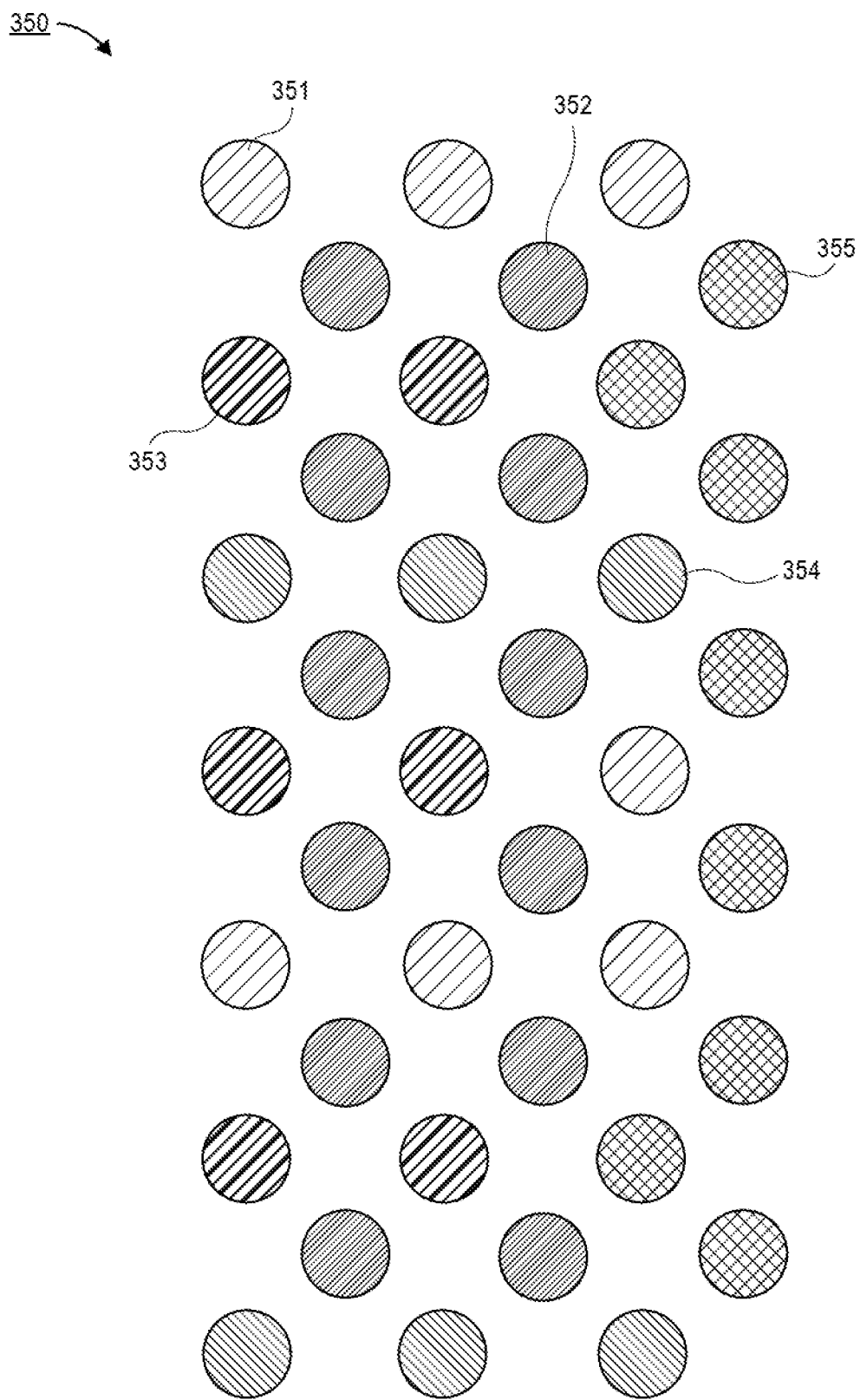
FIG. 3A is a plan view illustration of a C4 bumpout, in accordance with an embodiment.

Referring now to FIG. 3A a plan view illustration of a C4 bumpout 350 of a die is shown, in accordance with an embodiment. In an embodiment, the C4 bumpout 350 may comprise an array of pads. In an embodiment, the pads may be dedicated for different purposes. For example, the array may comprise power pads 351, data pads 352 (e.g., DDR DQ pads), strobe pads 353 (e.g., DDR DQS), ground pads 354, and pads 355 for other purposes (e.g., power, etc.). The arrangement of the pads 351-355 shown in FIG. 3A is exemplary in nature, and embodiments may conform to any C4 bumpout configuration. In a particular embodiment, the C4 bumpout 350 may be a DDR5 SDRAM bumpout or any subsequent generation of DDR SDRAM C4 bumpout.

Figure 3B:
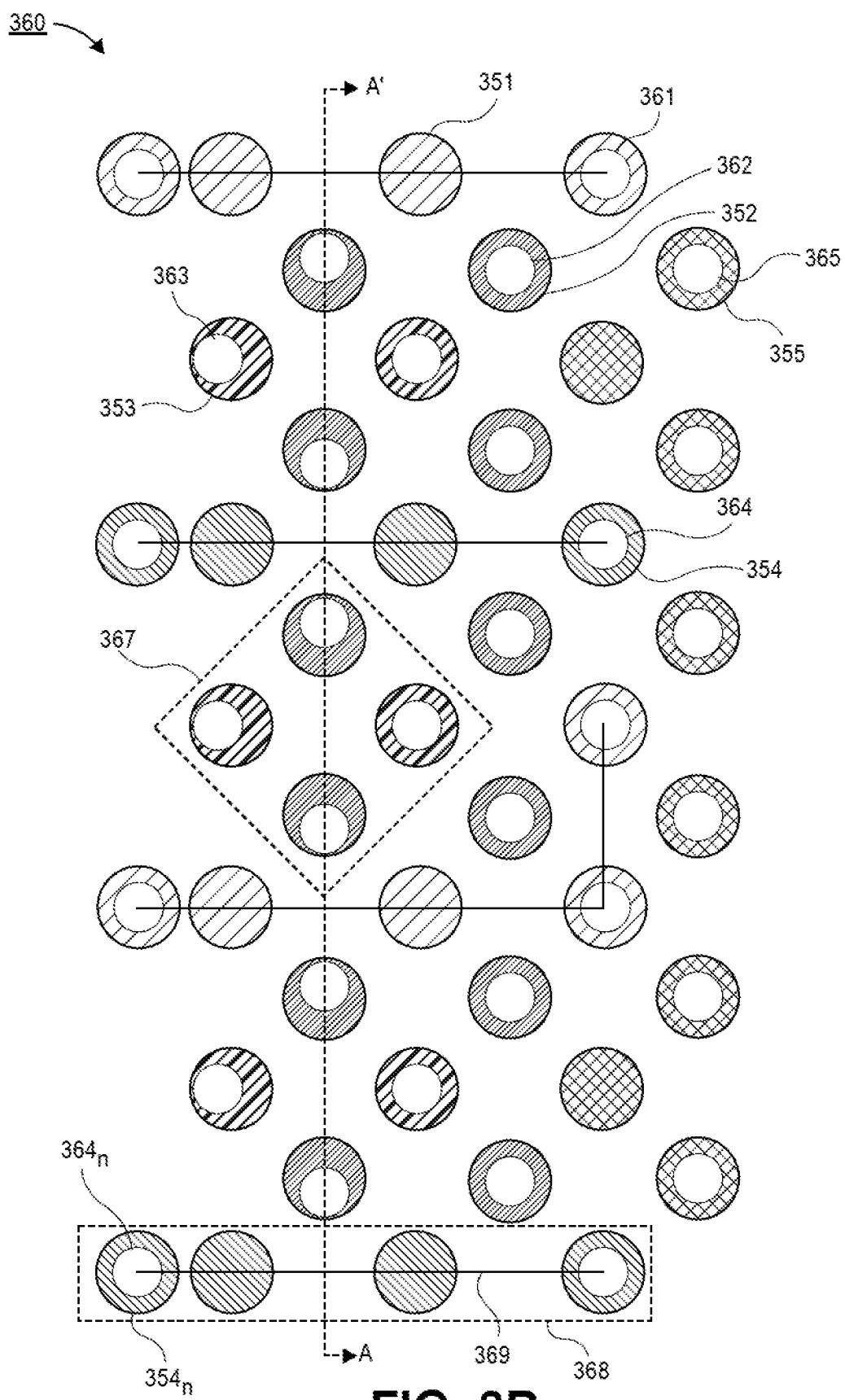
FIG. 3B is a plan view illustration of a surface layer of a package substrate that comprises pads that match the C4 bumpout and offset vias that may be used to provide space for subsequent escape routing, in accordance with an embodiment.

Referring now to FIG. 3B a plan view illustration of a surface layer 360 of the package substrate is shown, in accordance with an embodiment. In an embodiment, the surface layer 360 may comprise an array of pads 351-355 that correspond to pads 351-355 described above with respect to FIG. 3A. That is, surface layer 360 may comprise power pads 351, data pads 352, strobe pads 353, ground pads 354, and other pads 355. The pads on the surface layer 360 may be coupled to the pads on the bumpout layer 350 of the die with C4 bumps.

In an embodiment, some of the pads 351-355 on the surface layer 360 may have vias below the pads 351-355. For example, power vias 361 may be below power pads 351, data vias 362 may be below data pads 352, strobe vias 363 may be below strobe pads 353, ground vias 364 may be below ground pads 354, and other vias 365 may be below other pads 355.

In an embodiment, some of the vias may be redistributed. That is, an additional pad (not present on the bumpout layer) may be added in order to provide space in subsequent layers to provide coplanar routing. For example, the region inside dashed box 368 includes a redistributed via. As shown, ground pad 354$_n$ and ground via 364$_n$ are added to the surface layer 360. The ground pad 354$_n$ and ground via 364$_n$ may be electrically coupled to ground pad 354 by a trace 369. While a ground via 364 is being shown as being redistributed, it is to be appreciated that other types of vias 361-365 may also be redistributed in accordance with various embodiment.

Additional room for subsequent routing may be provided by offsetting vias. For example, the region inside dashed box 367 illustrates an example of such offset vias. As shown, the data vias 362 are offset from the overlying data pads 352 and one of the strobe vias 363 is offset from the overlying strobe pad 353.

It is to be appreciated that via redistribution and offset vias are possible under current design rules. For example, current design rules account for a certain amount of overlay error. Accordingly, the desired offset may be included in the overlay budget. For example, when the overlay budget is 50 microns, then an offset of up to 25 microns may be obtained if the tools used to fabricate the package substrate have an overlay error of only 25 microns. As will be appreciated, as the overlay error of tools decreases, and even greater offset is possible (e.g., greater than 25 microns).

Figure 3C:
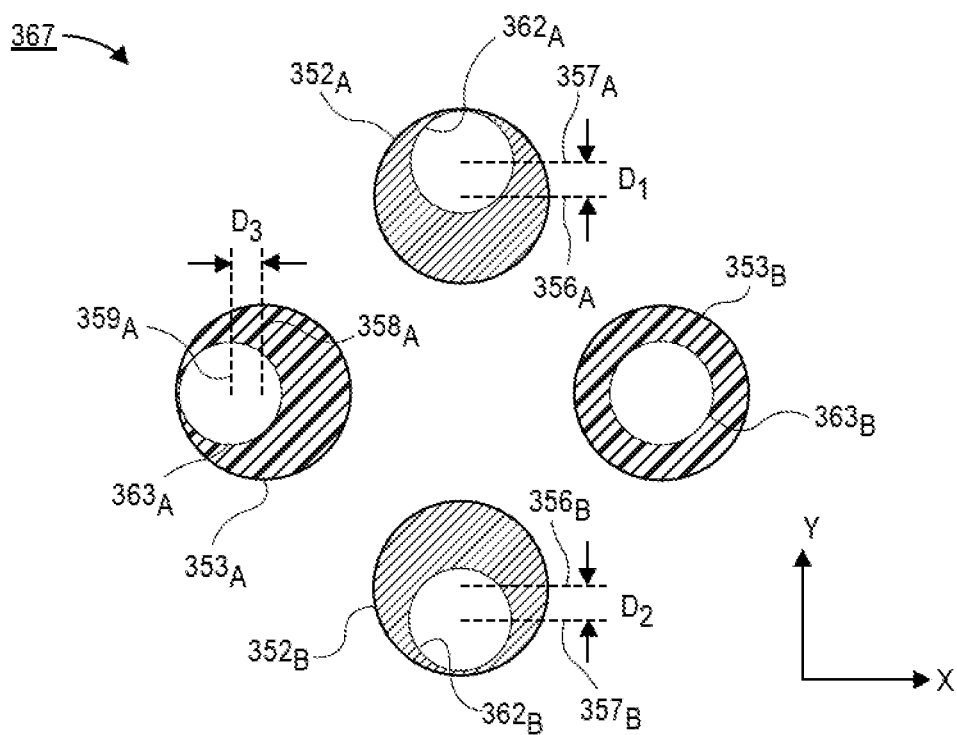
FIG. 3C is a plan view illustration of a portion of the surface layer of the package that more clearly illustrates the via offsets, in accordance with an embodiment.

Referring now to FIG. 3C, a zoomed in plan view illustration of the region inside dashed box 367 is shown, in accordance with an embodiment. In an embodiment, the region includes strobe pads 353 and data pads 352. In an embodiment, the strobe pads 353 and the data pads 352 may form a diamond pattern. That is, each pad 352/353 may be positioned at a corner of a diamond shape. In an embodiment, a first data pad 352$_A$ may be positioned at an opposite corner from a second data pad 352$_B$, and a first strobe pad 353$_A$ may be positioned at an opposite corner from a second strobe pad 353$_B$.

In an embodiment, the data vias 362$_A$ and 362$_B$ may be offset from their overlying data pads 352$_A$ and 352$_B$. In a particular embodiment, the offsets are relative to the centerlines of the pads 352 and vias 362. For example, the centerline 357$_A$ of a first data via 362$_A$ may be offset in the positive Y direction from the centerline $356_A$ of the first data pad $352_A$ by a distance $D_1$. In an embodiment, the centerline $357_B$ of a second data via $362_B$ may be offset in the negative Y direction from the centerline $356_B$ of the second data pad $352_B$ by a distance $D_2$. In an embodiment, the offsets are in opposite directions (e.g., positive Y and negative Y) in order to provide as much space for routing in subsequent layers as possible. In other embodiments, only one of the first data via $362_A$ and the second data via $362_B$ may have an offset.

Furthermore, it is noted that the offsets $D_1$ and $D_2$ are distinct from any offset attributable to overlay error. Particularly, the offsets $D_1$ and $D_2$ are implemented with the purpose of increasing the space between the vias $362_A$ and $362_B$. As such, the offsets $D_1$ and $D_2$ are in different directions from each other. In contrast, via offsets that are the result of overlay error will generally be in the same direction, and the spacing between the vias will not be increased.

In an embodiment, the strobe via $363_A$ may be offset from the overlying strobe pad $353_A$. In a particular embodiment, the offset is relative to the centerlines of the pad $353_A$ and via $363_A$. For example, the centerline $359_A$ of a first strobe via $363_A$ may be offset in the negative X direction from the centerline $358_A$ of the first strobe pad $353_A$ by a distance $D_3$. In an embodiment, the second strobe via $363_B$ may not be offset from the second strobe pad $353_B$. However, it is to be appreciated that in other embodiments, the second strobe via $363_B$ may be offset relative to the second strobe pad $353_B$ (e.g., in the positive X direction).

Similar to the offsets for the data vias 362, it is noted that the offset $D_3$ is distinct from any offset attributable to overlay error. Particularly, the offset $D_3$ is implemented with the purpose of increasing the space between the vias $363_A$ and $363_B$. As such, the spacing between the vias $363_A$ and $363_B$ will be different than the standard spacing between non-offset vias in the same layer. In contrast, via offsets that are the result of overlay error will generally be in the same direction, and the spacing between the vias will not be increased.

Figure 3D:
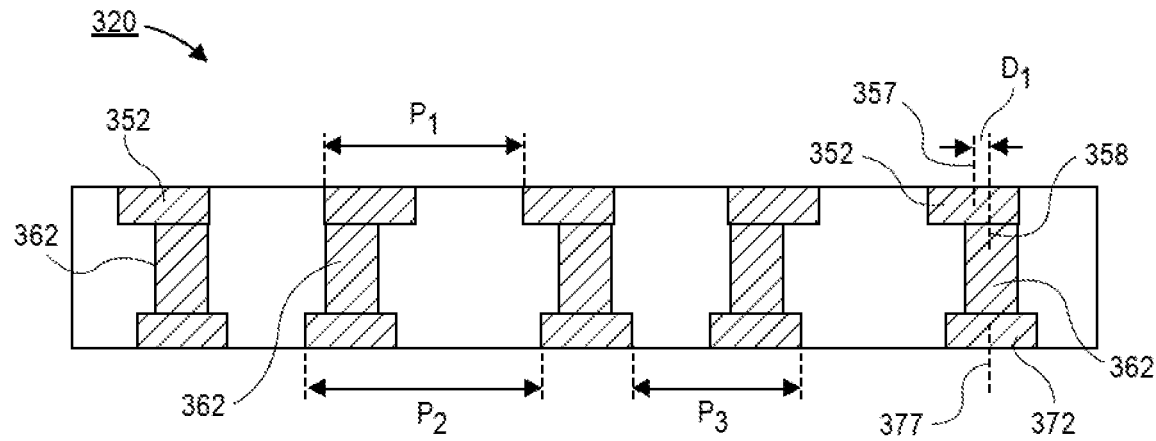
FIG. 3D is a cross-sectional illustration of the surface layer, a via layer with offsets, and the first routing layer that shows how the pitch of the pads in the first routing layer are modified by the via offsets, in accordance with an embodiment.

Referring now to FIG. 3D, a cross-sectional illustration of a portion of the package substrate 320 along line A-A' in FIG. 3B is shown, in accordance with an embodiment. In the illustrated embodiment, the surface layer including data pads 352, the data vias 362, and data pads 372 of the first routing layer are shown.

In an embodiment, the pitch $P_1$ of the data pads 352 of the surface layer is substantially uniform. That is the pitch $P_1$ of the data pads 352 may match the C4 bump pitch of the die. However, the data pads 372 in the first routing layer have a non-uniform pitch. For example, the data pads 372 may comprise a pitch $P_2$ and a pitch $P_3$. The larger pitch $P_2$ provides additional room for routing in order to accommodate coplanar routing in the first routing layer (not shown in FIG. 3D for simplicity).

The variation in the pitch $P_2$ and pitch $P_3$ is attributable to the via offsets. For example, centerline 358 of data via 362 is offset a distance $D_1$ from a centerline 357 of data pad 352. The underlying data pad 372 may be substantially aligned with data via 362 (e.g., centerline 377 is substantially aligned with centerline 358).

Figure 3E:
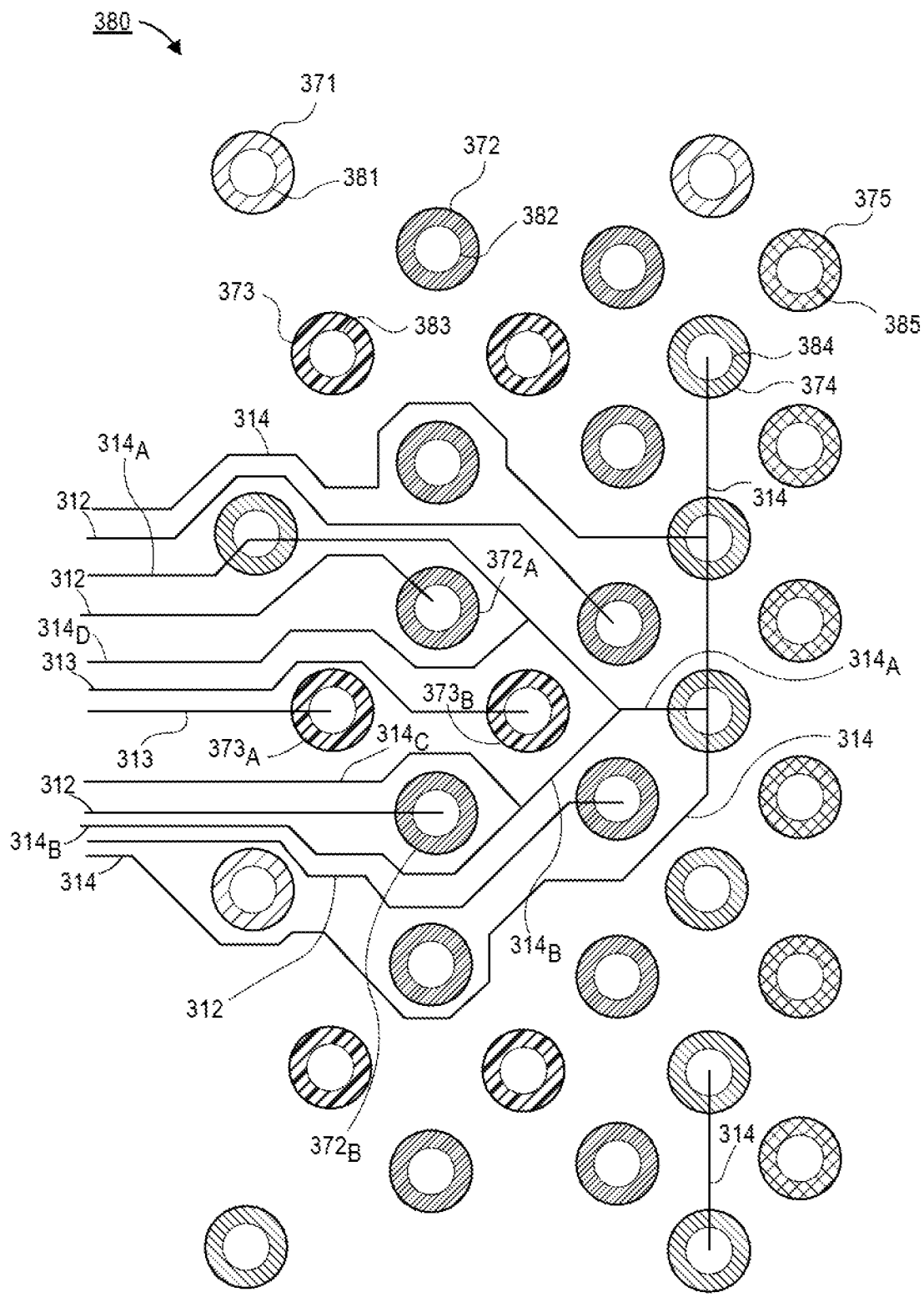
FIG. 3E is a plan view illustration of the first routing layer, in accordance with an embodiment.

While the via offsets in FIGS. 3D and 3E particularly illustrate offsets for the data vias 362 and the strobe vias 363, it is to be appreciated that other vias may also include offsets, depending on the package. For example, ground vias 364 and power vias 361 may also be offset in some embodiments. Furthermore, it is to be appreciated that not all vias of given type need to be offset if one of the vias of that type is offset.

Referring now to FIG. 3E, a plan view illustration of a first routing layer 380 is shown, in accordance with an embodiment. In an embodiment, pads 371-375 may be coupled to the surface layer 360 by the vias 361-365. The first routing layer may include power pads 371, data pads 372, strobe pads 373, ground pads 374, and other pads 375. In an embodiment, vias 381-385 may be formed under corresponding pads 371-375 (e.g., power vias 381 under power pads 371, data vias 382 under data pads 372, strobe vias 383 under strobe pads 373, ground vias 384 under ground pads 374, and other vias 385 under other pads 375).

In an embodiment, the first routing layer 380 may also comprise a plurality of traces to provide escape routing from the pads 371-375. Particularly, embodiments include escape routing for data lines and strobe lines that are bracketed by ground lines in order to provide coplanar routing architectures. For example, data traces 312 extending from data pads $372_A/372_B$ and strobe traces 313 extending from strobe pads $373_A/373_B$ may be bracketed by ground traces 314.

In order to more clearly illustrate embodiments disclosed herein, a third data pad $372_A$, a fourth data pad $372_B$, a third strobe pad $373_A$, a fourth strobe pad $373_B$, and their respective escape routings are explained in greater detail. However, it is to be appreciated that similar escape routing schemes that include coplanar routing configurations may be included in any of the escape routing in the first routing layer 380.

In an embodiment, the third data pad $372_A$ may be below the first data pad $352_A$ (shown in FIG. 3C) and the fourth data pad $372_B$ may be below the second data pad $352_B$ (shown in FIG. 3C). Since vias $362_A$ and $362_B$ were offset vias, the spacing between the third data pad $372_A$ and the fourth data pad $372_B$ is larger than the spacing between other pads in the first routing layer 380. Similarly, the third strobe pad $373_A$ may be below the first strobe pad $353_A$, and the fourth strobe pad $373_B$ may be below the second strobe pad $353_B$. Since via $363_A$ was an offset via, the spacing between the third strobe pad $373_A$ and the fourth strobe pad $373_B$ may be larger than spacing between other pads in the first routing layer 380.

In an embodiment, a first ground trace $314_A$ may extend towards the group of data pads $372_A/372_B$ and strobe pads $373_A/373_B$. Prior to reaching the fourth strobe pad $373_B$, the first ground trace $314_A$ may branch into a first ground trace $314_A$ that diverts towards the third data pad $372_A$ and a second ground trace $314_B$ that diverts towards the fourth data pad $372_B$. In an embodiment, the first ground trace $314_A$ may continue around the third data pad $372_A$ and include a branch that provides a fourth ground trace $314_D$ that passes through the diamond pattern. In an embodiment, the second ground trace $314_B$ may continue around the fourth data pad $372_B$ and include a branch that provides a third ground trace $314_C$ that passes through the diamond pattern. In an embodiment, the first ground trace $314_A$ and the fourth ground trace $314_D$ surround the third data pad $372_A$ and bracket the data trace 312 extending out from the third data pad $372_A$. In an embodiment, the second ground trace $314_B$ and the third ground trace $314_C$ surround the fourth data pad $372_B$ and bracket the data trace 312 extending out from the fourth data pad $372_B$. Accordingly, the data paths include a coplanar routing configuration in the bumpout region.

Similarly, the third ground trace $314_C$, the fourth ground trace $314_D$, and portions of the first ground trace $314_A$ and the second ground trace $314_B$ wrap around the third strobe pad $373_A$, the fourth strobe pad $373_B$ and the strobe traces 313 extending therefrom.

As shown in FIG. 3E, the diamond pattern formed by the data pads $372_A/372_B$ and strobe pads $373_A/373_B$ is expanded compared to the diamond pattern in FIG. 3B. Accordingly, the third and fourth ground traces $314_C/314_D$ are able to pass through the center of the diamond pattern (in addition to the strobe trace 313 from the fourth strobe pad $373_B$). The expanded diamond pattern therefore allows for the coplanar routing arrangement where each data trace 312 and strobe trace 313 is bracketed by ground traces 314. Furthermore, as shown in FIG. 3E, each of the data pads 372 that have a data trace 312 extending from them (i.e., including the data pads that are not explicitly labeled as part of the diamond pattern) have ground traces 314 extending around them and bracketing the data trace 312.

Figure 3F:
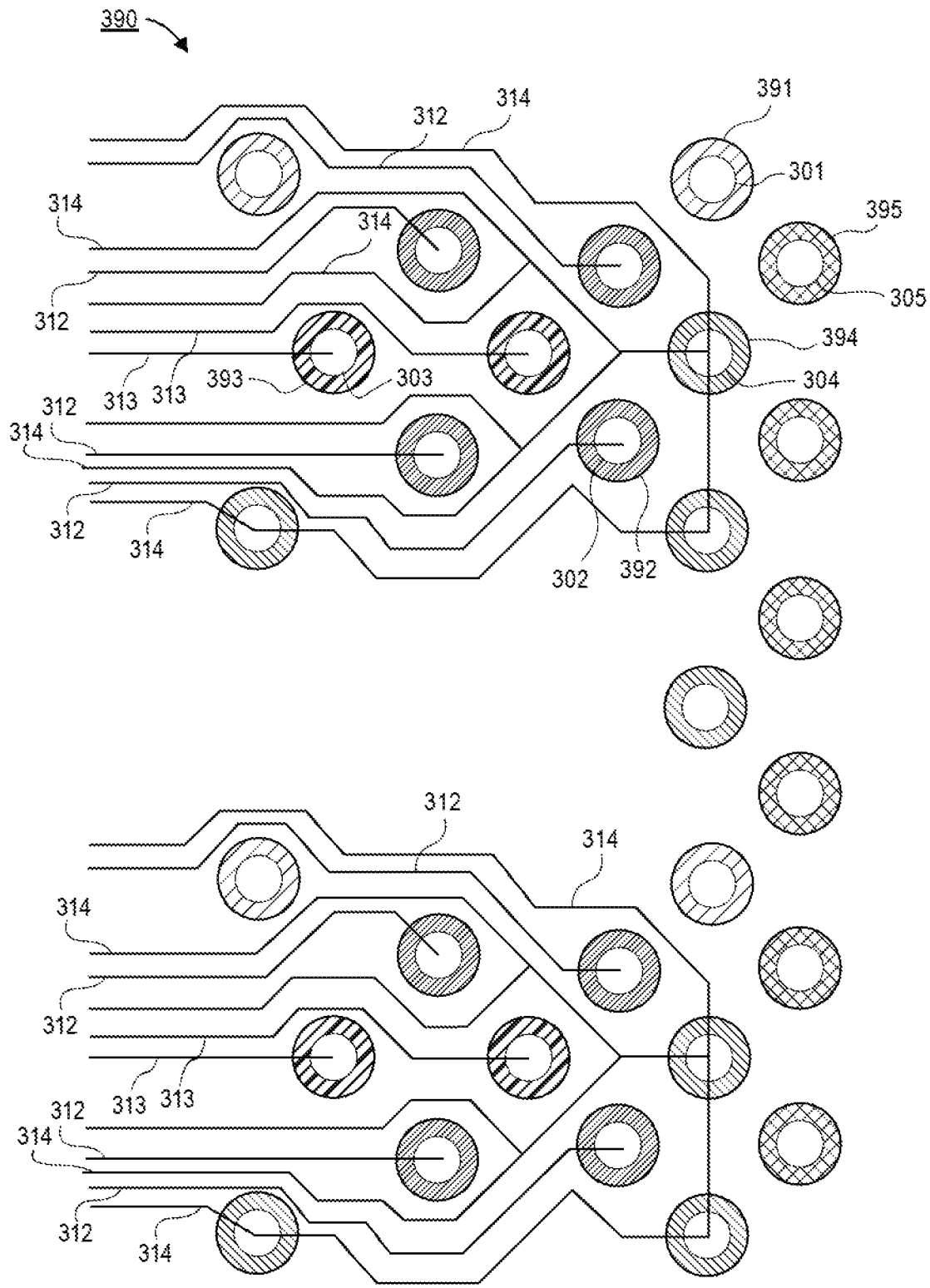
FIG. 3F is a plan view illustration of the second routing layer, in accordance with an embodiment.

Referring now to FIG. 3F, a plan view illustration of a second routing layer 390 is shown, in accordance with an embodiment. In an embodiment, pads 391-395 may be coupled to the first routing layer 380 by the vias 381-385. The second routing layer 390 may include power pads 391, data pads 392, strobe pads 393, ground pads 394, and other pads 395. In an embodiment, vias 301-305 may be formed under corresponding pads 391-395 (e.g., power vias 301 under power pads 391, data vias 302 under data pads 392, strobe vias 303 under strobe pads 393, ground vias 304 under ground pads 394, and other vias 305 under other pads 395).

Similar to the first routing layer 380, each of the data pads 392 and data traces 312, and each of the strobe pads 393 and strobe traces 313 are surrounded and bracketed by ground traces 314. Accordingly, the entire bumpout region may include coplanar routing architecture in order to minimize crosstalk.

Furthermore, it is to be appreciated that the second routing layer 390 still benefits from expanded patterns provided by the via offsets below the surface layer. As shown, the diamond patterns comprising data pads 392 and strobe pads 393 are expanded in order to allow for additional traces (e.g., ground traces 314) to pass through the interior of the diamond pattern in order to provide complete coplanar routing of the entire bumpout region. Additionally, while two routing layers are shown as providing adequate space for allowing fully coplanar routing, it is to be appreciated that in some embodiments additional routing layers may also be used. Accordingly, embodiments are not limited to the bumpout region being only in a first and second routing layer.

It is to be appreciated that after the bumpout region, there is additional space available to continue the coplanar routing configuration. Those skilled in the art will appreciate that routing plans may be constructed to continue the coplanar routing to the pin region.

Figure 4:
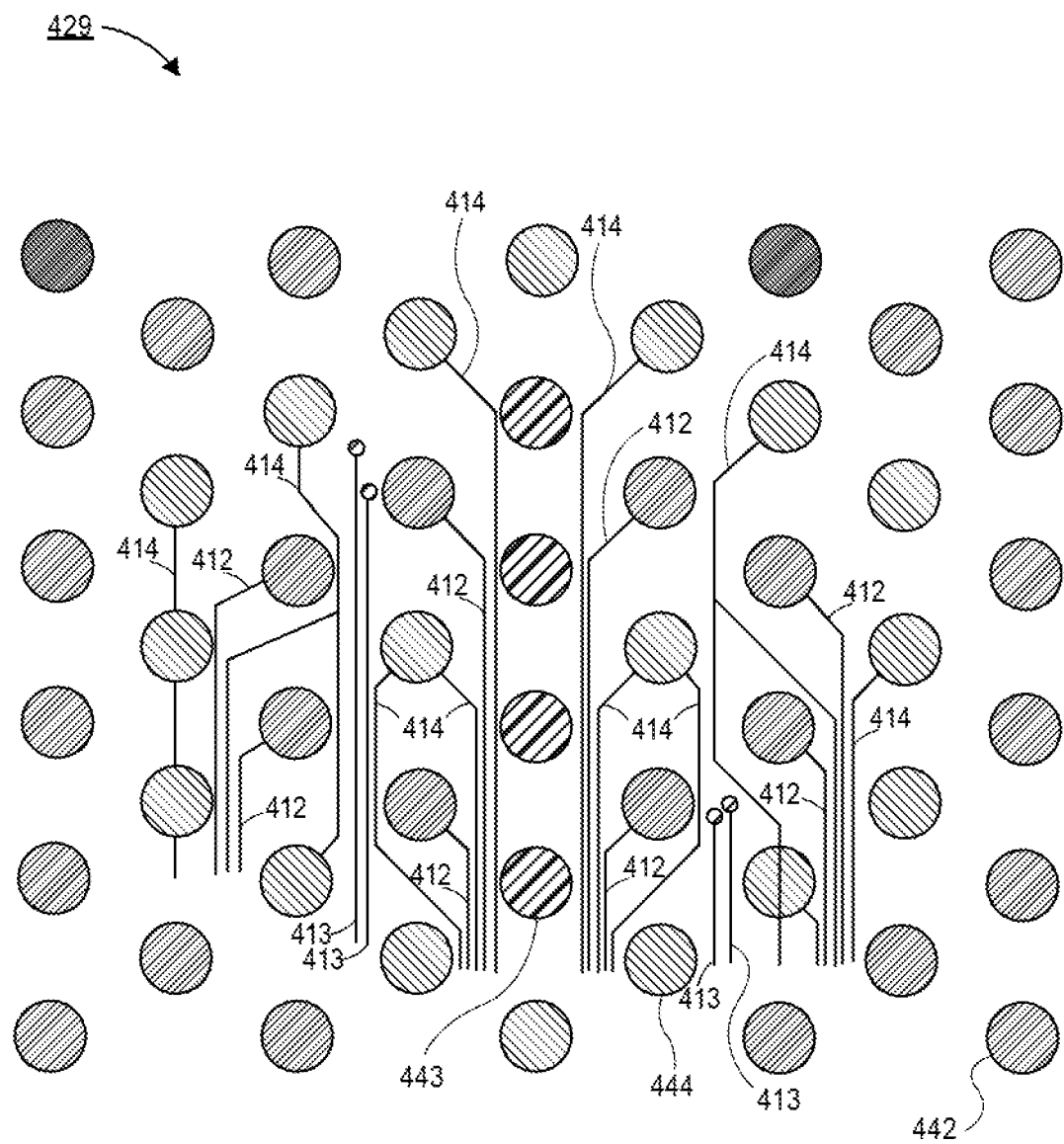
FIG. 4 is a plan view illustration of the package pin layer, in accordance with an embodiment.

Referring now to FIG. 4, a plan view illustration of the pin region 429 of a package substrate is shown, in accordance with an embodiment. As shown, the pin region may comprise data pads 442, strobe pads 443, and ground pads 444. The pads 442, 443, and 444 may be coupled to pins or any other interconnect.

In an embodiment, the data traces 412 and the strobe traces 413 are each bracketed by ground traces 412 up to the point where the data traces 412 and the strobe traces 413 reach their respective pads 442 and 443. Accordingly, embodiments allow for coplanar routing end-to-end in the package substrate. That is, the coplanar routing may begin in the bumpout region and continue all the way to the pins. As such, embodiments provide reduced crosstalk and are able to support increased data rates (e.g., 10 GT/s or greater). Furthermore, such embodiments allow for a reduction the layer count compared to stripline routing. Additionally, the end-to-end coplanar routing is still compatible with existing C4 bump layouts (e.g., DDR SDRAM layouts, such as DDR5 I/O layouts).

Figure 5:
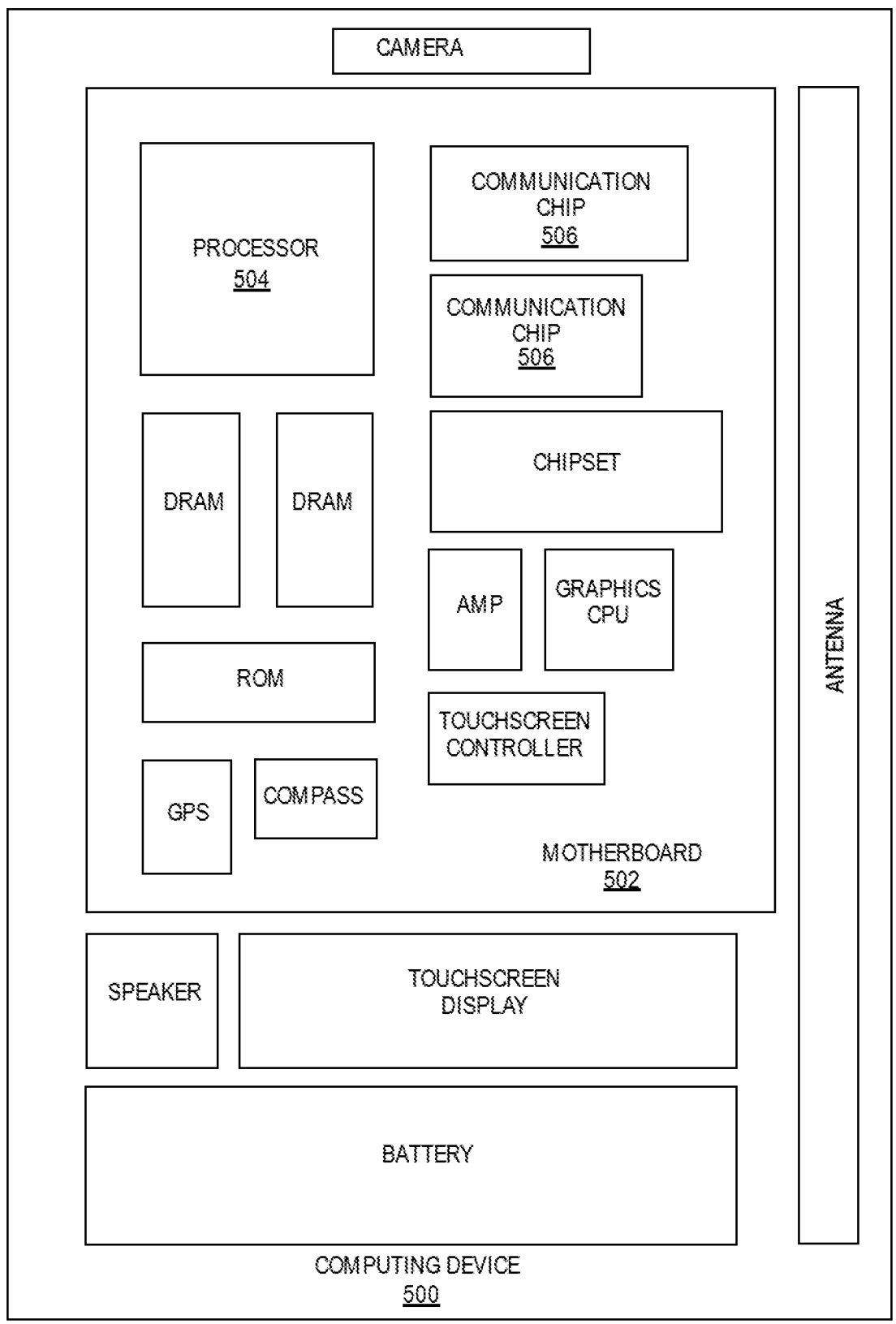
FIG. 5 is a schematic of a computing device built in accordance with an embodiment.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor may be packaged in an electronic system that comprises a package substrate with end-to-end coplanar routing architectures, in accordance with embodiments described herein. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip may be packaged in an electronic system that comprises a package substrate with end-to-end coplanar routing architectures, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a package substrate, comprising: a bumpout region on a first surface of the package substrate; a pin region on a second surface of the package substrate; a data path from the bumpout region to the pin region; and a ground path that brackets the data path from the bumpout region to the pin region.

Example 2: the package substrate of Example 1, wherein the data path comprises: a first pad in the bumpout region of the first surface of the package substrate; and a first via below the first pad, wherein a centerline of the first via is offset from a centerline of the first pad.

Example 3: the package substrate of Example 1 or Example 2, wherein the data path further comprises: a second pad below the first via; and a data trace extending from the second pad in a first direction; and wherein the ground path comprises: a first ground trace that extends toward the second pad from a second direction that is opposite from the first direction and branches into a first ground trace and a second ground trace, wherein the first ground trace and the second ground trace bracket the second pad and the data trace.

Example 4: the package substrate of Examples 1-3, wherein the centerline of the first via is offset from the centerline of the first pad by 25 microns or more.

Example 5: the package substrate of Examples 1-4, wherein the bumpout region comprises a redistributed ground pad.

Example 6: a package substrate, comprising: a surface layer, wherein the surface layer comprises: a plurality of first ground pads; a first data pad and a second data pad; and a first strobe pad and a second strobe pad, wherein the first data pad, the second data pad, the first strobe pad, and the second strobe pad are arranged in a diamond pattern with the first data pad and the second data pad on opposite points of the diamond pattern; and a first routing layer below the surface layer, wherein the first routing layer comprises: a plurality of second ground pads; a third data pad and a fourth data pad, wherein the third data pad is electrically coupled to the first data pad by a first via, wherein the fourth data pad is electrically coupled to the second data pad by a second via, and wherein a centerline of the first via is offset from a centerline of the first data pad; and a third strobe pad and a fourth strobe pad, wherein the third strobe pad is electrically coupled to the first strobe pad by a third via, and wherein the fourth strobe pad is electrically coupled to the second strobe pad by a fourth via.

Example 7: the package substrate of Example 6, wherein a centerline of the second via is offset from a centerline of the second data pad.

Example 8: the package substrate of Example 6 or Example 7, wherein the first via is offset in a first direction, and wherein the second via is offset in a second direction that is opposite from the first direction.

Example 9: the package substrate of Examples 6-8, wherein a centerline of the third via is offset from a centerline of the first strobe pad.

Example 10: the package substrate of Examples 6-9, wherein the third via is offset in a third direction that is orthogonal to the first direction.

Example 11: the package substrate of Examples 6-10, further comprising: a first ground trace extending from one of the plurality of second ground pads towards the fourth strobe pad, wherein the ground trace branches into a second ground trace, a third ground trace, and a fourth ground trace, wherein two or more of the first ground trace, the second ground trace, the third ground trace, and the fourth ground trace bracket each of the third data pad, the fourth data pad, the third strobe pad, and the fourth strobe pad.

Example 12: the package substrate of Examples 6-11, further comprising: a first data trace extending out from the third data pad; and a second data trace extending out from the fourth data pad.

Example 13: the package substrate of Examples 6-12, wherein the first data trace is bracketed by the first ground trace and the fourth ground trace, and wherein the second data trace is bracketed by the second ground trace and the third ground trace.

Example 14: the package substrate of Examples 6-13, wherein the first data trace is electrically coupled to a first data pin by a first conductive path, and the second data trace is electrically coupled to a second data pin by a second conductive path, and wherein an entire length of the first conductive path and the entire length of the second conductive path are bracketed by ground traces.

Example 15: the package substrate of Examples 6-14, further comprising: a first strobe trace extending out from the third strobe pad; and a second strobe trace extending out from the fourth strobe pad.

Example 16: the package substrate of Examples 6-15, wherein the first strobe trace and the second strobe trace are bracketed by the third ground trace and the fourth ground trace.

Example 17: the package substrate of Examples 6-16, wherein the second strobe trace, the third ground trace, and the fourth ground trace pass through an interior of the diamond pattern.

Example 18: the package substrate of Examples 6-17, wherein the centerline of the first via is offset from the centerline of the first data pad by 25 microns or more.

Example 19: the package substrate of Examples 6-18, wherein the surface layer further comprises: a redistributed ground pad.

Example 20: the package substrate of Examples 6-19, wherein the surface layer further comprises: a plurality of power pads.

Example 21: the package substrate of Examples 6-20, wherein the package substrate supports a double data rate synchronous dynamic random access memory (DDR SDRAM).

Example 22: the package substrate of Examples 6-21, wherein the DDR SDRAM is DDR5 SDRAM or a subsequent generation of DDR DRAM.

Example 23: an electronic system, comprising: a die; a package substrate supporting the die, the package substrate comprising: a bumpout region on a first surface of the package substrate, wherein the die is attached to the package substrate over the bumpout region; a pin region on a second surface of the package substrate; a data path from the bumpout region to the pin region; and a coplanar ground path bracketing the data path from the bumpout region to the pin region.

Example 24: the electronic system of Example 23, wherein the pin region of the package substrate interfaces with a printed circuit board (PCB).

Example 25: the electronic system of Example 23 or Example 24, wherein the data path comprises: a pad; and a via, wherein a centerline of the via is offset from a centerline of the pad.

What is claimed is:

1. A package substrate, comprising:
   a bumpout region on a first surface of the package substrate;
   a pin region on a second surface of the package substrate;
   a data path from the bumpout region to the pin region, the data path comprising a data trace having a longest length extending along a horizontal direction; and
   a ground path that brackets the data path from the bumpout region to the pin region, the ground path comprising a first ground trace having a longest length extending along the horizontal direction at a first side of the data trace, and a second ground trace having a longest length extending along the horizontal direction at a second side of the data trace, the second side opposite the first side, wherein the data trace, the first ground trace and the second ground trace are co-planar with one another.

2. The package substrate of claim 1, wherein the data path comprises:
   a first pad in the bumpout region of the first surface of the package substrate; and
   a first via below the first pad, wherein a centerline of the first via is offset from a centerline of the first pad.

3. The package substrate of claim 2, wherein the data path further comprises:
   a second pad below the first via; and
      the data trace extending from the second pad in the horizontal direction;
   and wherein the ground path comprises:
      a ground trace that extends toward the second pad and branches into the first ground trace and the second ground trace, wherein the first ground trace and the second ground trace further bracket the second pad.

4. The package substrate of claim 2, wherein the centerline of the first via is offset from the centerline of the first pad by 25 microns or more.

5. The package substrate of claim 1, wherein the bumpout region comprises a redistributed ground pad.

6. An electronic system, comprising:
   a die;
   a package substrate supporting the die, the package substrate comprising:
      a bumpout region on a first surface of the package substrate, wherein the die is attached to the package substrate over the bumpout region;
      a pin region on a second surface of the package substrate;
      a data path from the bumpout region to the pin region, the data path comprising a data trace having a longest length extending along a horizontal direction; and
      a ground path bracketing the data path from the bumpout region to the pin region, the ground path comprising a first ground trace having a longest length extending along the horizontal direction at a first side of the data trace, and a second ground trace having a longest length extending along the horizontal direction at a second side of the data trace, the second side opposite the first side, wherein the data trace, the first ground trace and the second ground trace are co-planar with one another.

7. The electronic system of claim 6, further comprising a printed circuit board, wherein the pin region of the package substrate interfaces with the printed circuit board (PCB).

8. The electronic system of claim 6, wherein the data path comprises:
   a pad; and
   a via, wherein a centerline of the via is offset from a centerline of the pad.

* * * * *